United States Patent [19]
Parkes, Jr.

[11] Patent Number: 5,481,226
[45] Date of Patent: Jan. 2, 1996

[54] LOW-VOLTAGE INTERMEDIATE FREQUENCY AMPLIFIER PROVIDING AUTOMATIC GAIN CONTROL OF A SOURCE AMPLIFIER

[75] Inventor: John J. Parkes, Jr., Boynton Beach, Fla.

[73] Assignee: Motorola, Inc., Schaumburg, Ill.

[21] Appl. No.: 329,103

[22] Filed: Oct. 25, 1994

[51] Int. Cl.$^6$ ............................. H03G 3/30; H04B 1/06
[52] U.S. Cl. ............................. 330/279; 455/245.1
[58] Field of Search ............................. 330/129, 132, 330/278, 279; 455/234.1, 245.1, 250.1, 245.2

[56] References Cited

U.S. PATENT DOCUMENTS

| | | | |
|---|---|---|---|
| 4,794,342 | 12/1988 | Kimura | 330/2 |
| 5,321,851 | 6/1994 | Sugayama et al. | 455/245.1 X |
| 5,369,792 | 11/1994 | Matsumoto et al. | 455/245.1 |

FOREIGN PATENT DOCUMENTS 0158021  7/1991  Japan ............................. 455/250.1

OTHER PUBLICATIONS

Motorola, Inc., Linear and Interface Integrated Circuits, pp. 8–29 to 8–34, 1988, U.S.A.

*Primary Examiner*—Steven Mottola
*Attorney, Agent, or Firm*—R. Louis Breeden

[57] ABSTRACT

A low-voltage IF amplifier (112) provides automatic gain control (AGC) of a source amplifier (104) supplying an IF input signal to the IF amplifier (112). The IF amplifier (112) includes cascaded amplifier stages (202) that include an amplifier element (344) having an input (122) for receiving a stage input signal, and an output (124) for generating an amplified stage output signal in response. The amplifier stages (202) also include a received signal strength detector (346), or RSSD, for generating a gain control current responsive to the stage input signal. The IF amplifier (112) also includes a current summer (206) for summing the gain control currents generated by the RSSDs (346) to produce a total gain control current, and a gain control element (204) that controls the gain of the source amplifier (104) in response to the total gain control current, such that signal levels within the source amplifier (104) are maintained within a linear operating range.

10 Claims, 3 Drawing Sheets

LOW-VOLTAGE INTERMEDIATE FREQUENCY AMPLIFIER PROVIDING AUTOMATIC GAIN CONTROL OF A SOURCE AMPLIFIER

FIELD OF THE INVENTION

This invention relates in general to radio communication receivers, and more specifically to a radio communication receiver having a low-voltage intermediate frequency amplifier that provides automatic gain control of a source amplifier.

BACKGROUND OF THE INVENTION

Modern radio communication receivers typically utilize a radio frequency (RF) amplifier to achieve maximum sensitivity. The RF amplifier has a limited dynamic range, which can cause clipping of strong radio signals. Clipping generates spurious frequencies that can interfere with reception and demodulation of desired frequencies. For portable battery-powered receivers, which can operate from a single 1.5-volt cell, the dynamic range limitation can be severe—especially near the end of battery life when battery voltage drops to about 1.0 volt.

To prevent the RF amplifier from being overloaded by high signals, various automatic gain control (AGC) systems have been incorporated to control signal amplitudes. A problem that has been associated with such AGC systems has been that the AGC systems themselves have required more than 1.0 volt for operation. Conventional ways of solving the problem have included adding voltage multiplier circuits or using multiple-cell batteries to increase the operating voltage. Neither of these solutions is desirable in terms of cost and efficiency.

Thus, what is needed is an AGC system that can maintain receiver operation without signal overload, and that requires no more than 1.0 volt for reliable operation.

SUMMARY OF THE INVENTION

An aspect of the present invention is a low-voltage intermediate frequency (IF) amplifier for providing automatic gain control (AGC) of a source amplifier supplying an IF input signal to the low-voltage IF amplifier. The low-voltage IF amplifier comprises a plurality of cascaded amplifier stages. At least some of the plurality of cascaded amplifier stages comprise an amplifier element having an input for receiving a stage input signal, and an output for generating an amplified stage output signal in response to the stage input signal, and a received signal strength detector (RSSD) coupled to the amplifier element for generating a gain control current responsive to the stage input signal. The low-voltage IF amplifier further comprises a current summer coupled to the plurality of cascaded amplifier stages for summing the gain control currents generated by the RSSDs thereof to produce a total gain control current, and a gain control element coupled to the source amplifier and coupled to the current summer for controlling gain of the source amplifier in response to the total gain control current, such that signal levels within the source amplifier are maintained within a linear operating range. The gain control element comprises a current mirror that generates a source amplifier gain control current proportional to the total gain control current. The source amplifier gain control current is coupled to the source amplifier for controlling the gain thereof.

Another aspect of the present invention is a communication receiver comprising an antenna for intercepting a signal including information, and a receiver element coupled to the antenna for demodulating the signal to derive the information. The communication receiver further comprises a processor coupled to the receiver for processing the information, and an output element coupled to the processor for outputting the information. The communication receiver further comprises a power supply providing a power supply voltage between a circuit ground and a power supply node. The receiver element comprises a low-voltage intermediate frequency (IF) amplifier for providing automatic gain control (AGC) of a source amplifier supplying an IF input signal to the lowvoltage IF amplifier. The low-voltage IF amplifier comprises a plurality of cascaded amplifier stages, at least some of the plurality of cascaded amplifier stages comprising an amplifier element having an input for receiving a stage input signal, and an output for generating an amplified stage output signal in response to the stage input signal, and a received signal strength detector (RSSD) coupled to the amplifier element for generating a gain control current responsive to the stage input signal. The low-voltage IF amplifier further comprises a current summer coupled to the plurality of cascaded amplifier stages for summing the gain control currents generated by the RSSDs thereof to produce a total gain control current, and a gain control element coupled to the source amplifier and coupled to the current summer for controlling gain of the source amplifier in response to the total gain control current, such that signal levels within the source amplifier are maintained within a linear operating range. The gain control element comprises a current mirror that generates a source amplifier gain control current proportional to the total gain control current. The source amplifier gain control current is coupled to the source amplifier for controlling the gain thereof.

The at least some of the plurality of cascaded amplifier stages further comprise a received signal strength detector (RSSD) coupled to the amplifier element for generating a gain control current responsive to the stage input signal. The low-voltage IF amplifier further comprises a current summer coupled to the plurality of cascaded amplifier stages for summing the gain control currents generated by the RSSDs thereof to produce a total gain control current, and a gain control element coupled to the source amplifier and coupled to the current summer for controlling the gain of the source amplifier in response to the total gain control current, such that signal levels within the source amplifier are maintained within a linear operating range.

Another aspect of the present invention is a communication receiver comprising an antenna for intercepting a signal including information, and a receiver element coupled to the antenna for demodulating the signal to derive the information. The communication receiver further comprises a processor coupled to the receiver for processing the information, and an output element coupled to the processor for outputting the information. The communication receiver also includes a power supply providing a power supply voltage between a circuit ground and a power supply node. The receiver element comprises a low-voltage intermediate frequency (IF) amplifier for providing automatic gain control (AGC) of a source amplifier supplying an IF input signal to the IF amplifier. The low-voltage IF amplifier comprises a plurality of cascaded amplifier stages. At least some of the plurality of cascaded amplifier stages comprise an amplifier element having an input for receiving a stage input signal, and an output for generating an amplified stage output signal in response to the stage input signal. The at least some of the plurality of cascaded amplifier stages further comprise a received signal strength detector (RSSD) coupled to the amplifier element for generating a gain control current responsive to the stage input signal. The low-voltage IF amplifier further comprises a current summer coupled to the plurality of cascaded amplifier stages for summing the gain control currents generated by the RSSDs thereof to produce a total gain control current, and a gain control element coupled to the source amplifier and coupled to the current summer for controlling the gain of the source amplifier in response to the total gain control current, such that signal levels within the source amplifier are maintained within a linear operating range.

DESCRIPTION OF THE PREFERRED EMBODIMENT

Figure 1:
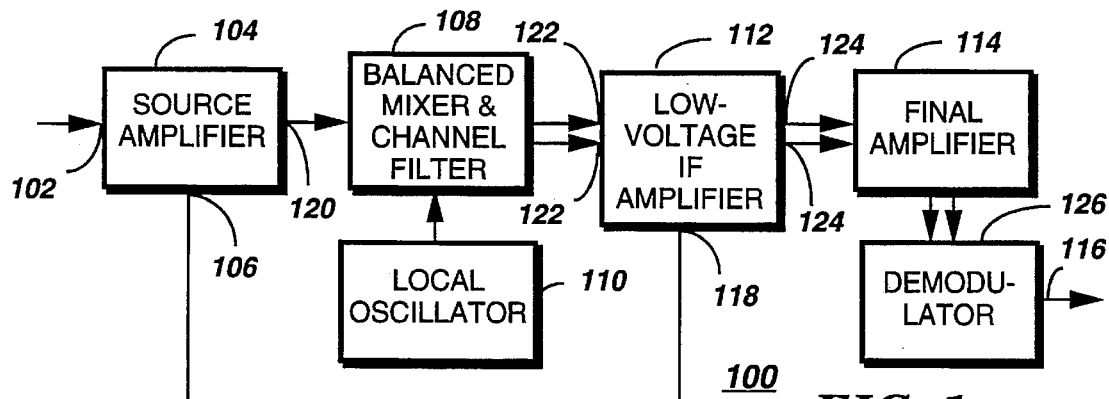
FIG. 1 is an electrical block diagram of a receiver element in accordance with the preferred embodiment of the present invention.

With reference to FIG. 1, an electrical block diagram depicts a receiver element 100 in accordance with the preferred embodiment of the present invention. The receiver element 100 comprises a radio frequency (RF) input 102 for receiving a radio signal. The source amplifier 104 comprises a gain control node 106 for controlling the gain of the source amplifier 104 by sinking a current therefrom. The source amplifier 104 further comprises an RF output 120 for producing an amplified RF signal responsive to the radio signal and the gain control node 106. The structure of the source amplifier 104 will be described in detail herein below.

The RF output 120 is coupled to a conventional balanced mixer and channel filter 108, which further amplifies, filters, and down-converts the amplified RF signal to produce an intermediate frequency (IF) signal. The balanced mixer and channel filter 108 is coupled to a conventional local oscillator 110 for receiving a frequency therefrom for mixing with the amplified radio signal. The IF signal is fed to a differential input 122 of an amplifier stage 202 (FIG. 2) of a low-voltage IF amplifier 112 in accordance with the preferred embodiment of the present invention. The low-voltage IF amplifier 112 comprises a gain control output 118 coupled to the gain control node 106 of the source amplifier 104 for controlling the gain of the source amplifier 104. The low-voltage IF amplifier 112 further comprises a differential output 124 at which an amplified IF signal is produced. The amplified IF signal is coupled to a conventional final amplifier 114, which is coupled to and drives a conventional demodulator 126 for demodulating the amplified IF signal in a manner well known in the art to produce a demodulated signal at a demodulator output 116. It will be appreciated that, alternatively, the input 122 and output 124 of the low-voltage IF amplifier 112 can be of non-differential type as well.

Figure 2:
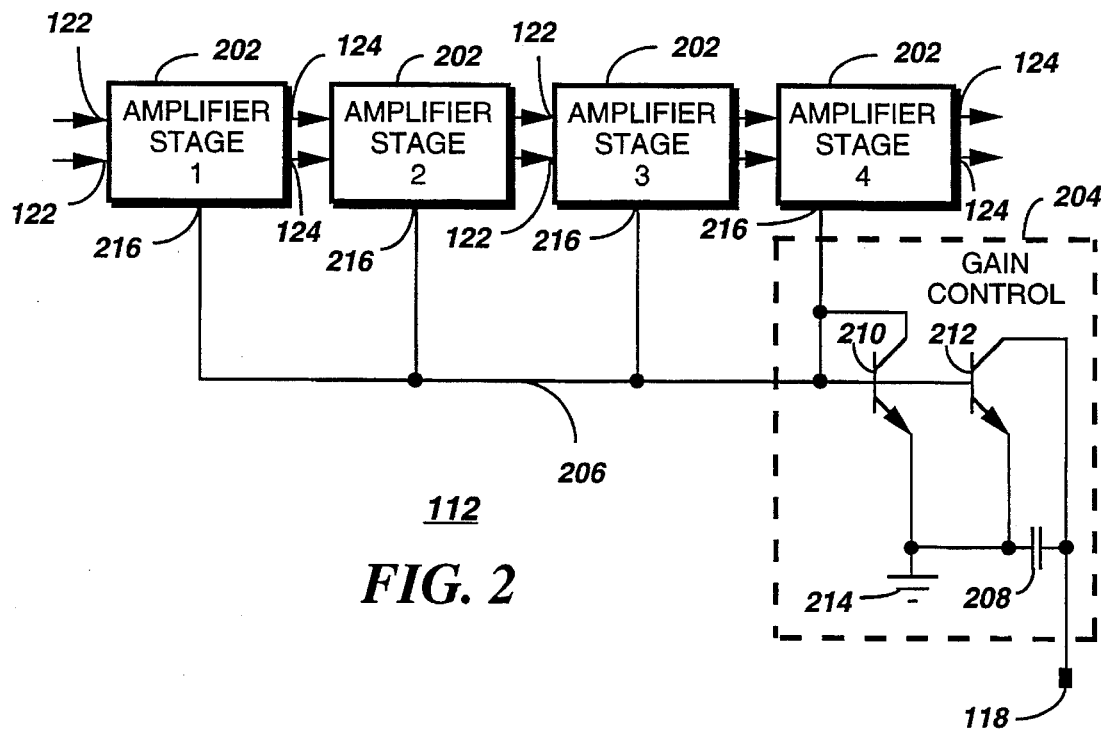
FIG. 2 is an electrical block diagram of a low-voltage intermediate frequency (IF) amplifier in accordance with the preferred embodiment of the present invention.

With reference to FIG. 2, an electrical block diagram depicts the low-voltage IF amplifier 112 in accordance with the preferred embodiment of the present invention. The low-voltage IF amplifier 112 comprises preferably four amplifier stages 202. It will be appreciated that other numbers of the amplifier stages 202 can be used as well, as a matter of design choice. Each amplifier stage 202 preferably comprises an automatic gain control (AGC) output 216 for providing an AGC current responsive to an input signal level present in each amplifier stage 202. The AGC currents from the AGC outputs 216 of the amplifier stages 202 are summed at a current summing node 206, to produce a total gain control current. The current summing node 206 is coupled to a gain control element 204 for feeding the total gain control current thereto. The structure of the amplifier stage 202 will be described in detail herein below.

The gain control element 204 preferably comprises an NPN transistor 210 having its base and collector connected to the current summing node 206 and connected to the base of an NPN transistor 212. The emitters of the transistors 210, 212 are both connected to the circuit ground 214. A capacitor 208 is coupled between the collector of transistor 212 and the circuit ground 214 to provide high-frequency roll-off to stabilize the gain control element 204. Thus connected, the gain control element 204 functions as a current mirror that generates, at the gain control output 118, a source amplifier gain control current proportional to the total gain control current produced at the current summing node 206. As described herein above, the source amplifier gain control current at the gain control output 118 is coupled to the gain control node 106 of the source amplifier 104 for controlling the gain thereof. The value of the capacitor 208 is preferably 0.22 µF. It will be appreciated that other capacitance values can be utilized as well for the capacitor 208, depending upon operating parameters such as the operating frequency of the receiver element 100.

Figure 3:
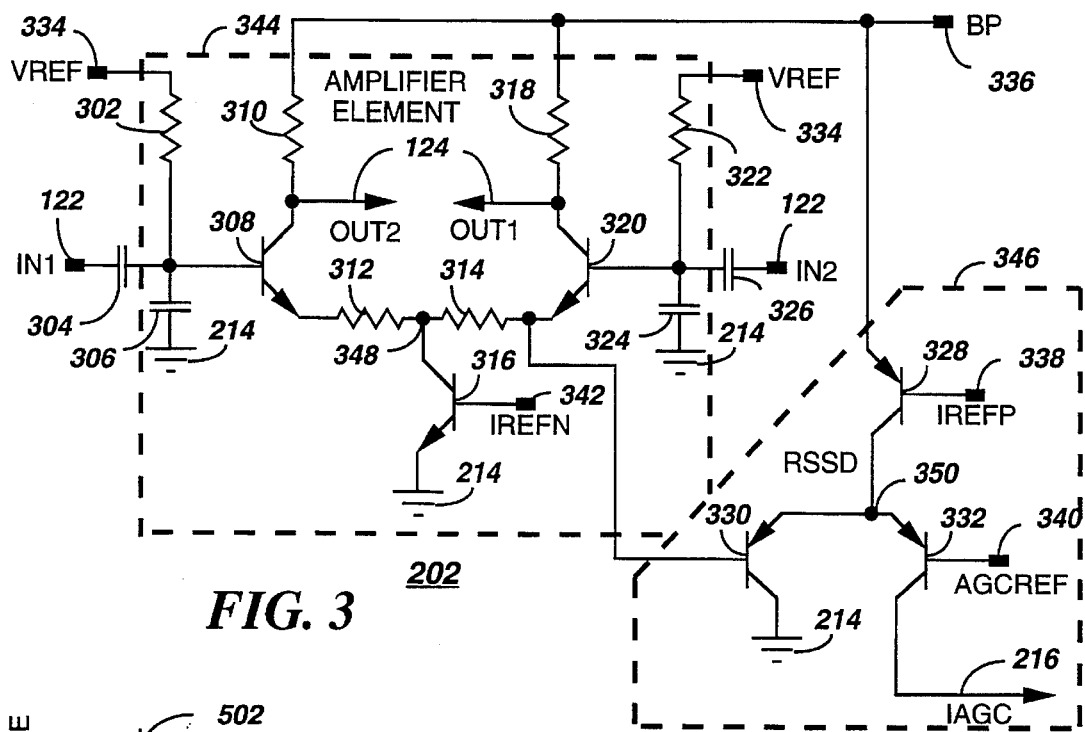
FIG. 3 is an electrical schematic diagram of an amplifier stage of the low-voltage IF amplifier in accordance with the preferred embodiment of the present invention.

With reference to FIG. 3, an electrical schematic diagram depicts the amplifier stage 202 of the low-voltage IF amplifier 112 in accordance with the preferred embodiment of the present invention. The amplifier stage 202 comprises two basic elements: an amplifier element 344, and a received signal strength detector (RSSD) 346. The amplifier element 344 has the differential input 122 for receiving a stage input signal, and the differential output 124 for generating an amplified stage output signal in response to the stage input signal. The RSSD 346 is coupled to the amplifier element 344 for generating a gain control current responsive to the stage input signal.

The amplifier element comprises a first transistor 308 having a collector, base, and emitter, preferably of NPN structure. The collector of the first transistor 308 is coupled through a first collector resistor 310 to a power supply node 336, and the base of the first transistor 308 is coupled through a first base resistor 302 to a base reference voltage node 334 and is also coupled through a first capacitor 306 to the circuit ground 214 and through a second capacitor 304 to a first input node IN1. The emitter of the first transistor 308 is coupled through a first emitter resistor 312 to a sink node 348.

The amplifier element further comprises a second transistor 320 having a collector, base, and emitter, preferably of NPN structure. The collector of the second transistor 320 is coupled through a second collector resistor 318 to the power supply node 336, and the base of the second transistor 320 is coupled through a second base resistor 322 to the base reference voltage node 334. The base of the second transistor 320 is also coupled through a third capacitor 324 to the circuit ground 214 and through a fourth capacitor 326 to a second input node IN2. The emitter of the second transistor 320 is coupled through a second emitter resistor 314 to the sink node 348. The amplifier element 344 also includes a third transistor 316 having a collector, base, and emitter, preferably of NPN structure. The collector of the third transistor 316 is coupled to the sink node 348 for sinking current therefrom, and the emitter of the third transistor 316 is coupled to the circuit ground 214. The base of the third transistor 316 is coupled to a first reference current node 342 for receiving a current that determines the current through the sink node 348. The first and second input nodes IN1, IN2 comprise the differential input 122 of the amplifier element 344, and the collectors of the first and second transistors 308, 320 comprise the differential output 124 of the amplifier element 344.

The RSSD comprises a fourth transistor 328 having a collector, base, and emitter, preferably of PNP structure. The emitter of the fourth transistor 328 is coupled to the power supply node 336, and the base of the fourth transistor 328 is coupled to a second reference current node 338 for setting a current through an operating node 350. The collector of the fourth transistor 328 is coupled to the operating node 350 for supplying the current thereto. The RSSD further comprises a fifth transistor 330 having a collector, base, and emitter, preferably of PNP structure. The emitter of the fifth transistor 330 is coupled to the operating node 350 for receiving current therefrom, and the base of the fifth transistor 330 is coupled to the emitter of the second transistor 320 for receiving a signal responsive to the stage input signal. The collector of the fifth transistor 330 is coupled to the circuit ground 214.

The RSSD also includes a sixth transistor 332 having a collector, base, and emitter, preferably of PNP structure. The emitter of the sixth transistor 332 is coupled to the operating node 350 for receiving current therefrom, and the base of the sixth transistor 332 is coupled to an AGC reference voltage node 340. The collector of the sixth transistor 332 is coupled to the current summing node 206 for supplying the gain control current thereto. The geometry and bias levels of the fifth and sixth transistors 330, 332 preferably are such that in response to a zero-amplitude stage input signal, the fifth transistor conducts a majority, e.g., about ninety percent, of the current available from the operating node 350. Preferably, this is accomplished by adjusting the voltage reference at the AGC reference voltage node 340 to equal the voltage at the emitter of the second transistor 320 when there is no stage input signal at the differential input 122. In addition, the geometry of the fifth transistor 330 is preferably adjusted by well-known integrated circuit design techniques to conduct about seven times the current conducted by the sixth transistor 332 for the equal base-emitter voltages present when there is no stage input signal. In response to a substantial-amplitude stage input signal, e.g., two-hundred millivolts peak-to-peak, the sixth transistor conducts a majority of the current available from the operating node during alternate half cycles of the stage input signal, thereby generating the AGC current at the AGC output 216. This occurs because during alternate half cycles the fifth transistor 330 is turned off, causing the sixth transistor 332 to deliver to the current summing node 206 substantially all of the current supplied to the operating node 350 by the fourth transistor 328.

It will be appreciated that the voltages provided at the base reference voltage node 334, the power supply node 336, and the AGC reference voltage node 340, as well as the currents supplied to the first reference current node 342 and the second reference current node 338 are preferably developed and provided by a power supply 718 (FIG. 7) utilizing circuits and techniques that are well known in the art. Nominal design values for the voltage and current references and component values of the amplifier stage 202 are listed below. It will be appreciated that other reference and component values can be utilized as well, as a matter of design choice and depending upon parameters such as the desired frequency of operation.

| | |
|---|---|
| Power supply node 336 (BP) | 1.0 volt |
| Base reference voltage node 334 (VREF) | 0.8 volt |
| AGC reference voltage node 340 (AGCREF) | 0.15 volt |
| First reference current node 342 (IREFN) | 5 microamps* |
| Second reference current node 338 (IREFP) | 10 microamps* |
| Collector resistors 310, 318 | 80K ohms |
| Base resistors 302, 322 | 250K ohms |
| Emitter resistors 312, 314 | 7.2K ohms |
| Capacitors 304, 326 | 35 pF |
| Capacitors 306, 324 | 3.5 pF |

*These values are current mirror values, i.e., they represent the collector currents of the transistors 316,328 whose bases are connected to the nodes 342,338.

Figure 4:
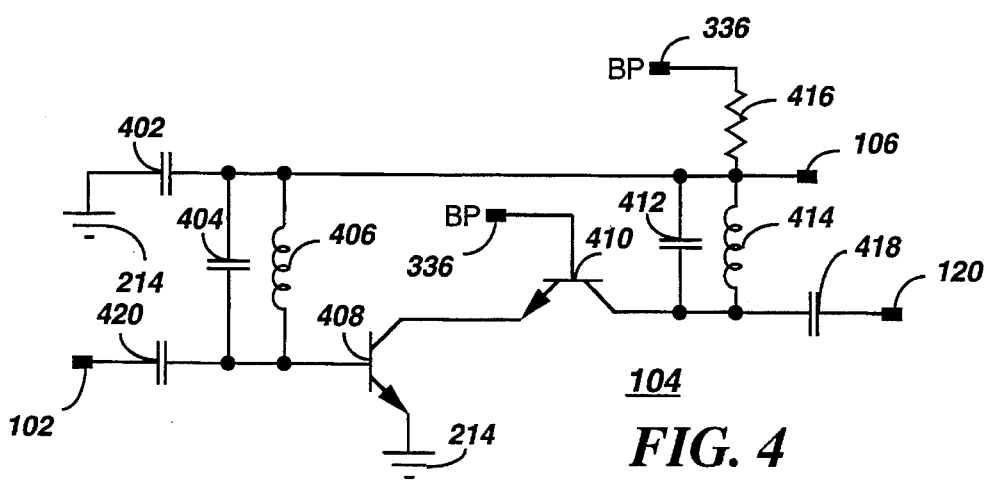
FIG. 4 is an electrical schematic diagram of a source amplifier for use with the low-voltage IF amplifier in accordance with the preferred embodiment of the present invention.

With reference to FIG. 4, an electrical schematic diagram depicts the source amplifier 104 for use with the low-voltage IF amplifier 112 in accordance with the preferred embodiment of the present invention. The source amplifier 104 comprises a first transistor 408 having a collector, base, and emitter, preferably of NPN structure. The base of the first transistor 408 is coupled through a first capacitor 420 to the RF input 102. The base of the first transistor 408 is also coupled through a parallel-connected second capacitor 404 and first inductor 406 to the gain control node 106. The second capacitor 404 and first inductor 406 form a resonant circuit for tuning the source amplifier 104. The gain control node 106 is coupled through a third capacitor 402 to the circuit ground 214, the third capacitor 402 being sized such that it produces a relatively low impedance at radio frequencies. The emitter of the first transistor 408 is coupled to the circuit ground 214.

The source amplifier 104 comprises a second transistor 410 having a collector, base, and emitter, preferably of NPN structure. The emitter of the second transistor 410 is coupled to the collector of the first transistor 408. The base of the second transistor 410 is coupled to the power supply node 336. The collector of the second transistor 410 is coupled through a parallel-connected fourth capacitor 412 and second inductor 414 to the gain control node 106. The fourth capacitor 412 and second inductor 414 form a resonant circuit for additional tuning of the source amplifier 104. The collector of the second transistor 410 is also coupled through a fifth capacitor 418 to the RF output 120 of the source amplifier 104. A resistor 416 is coupled between the power supply node 336 and the gain control node 106. The resistor 416 supplies a substantially constant current to the gain control node 106.

During normal operation of the receiver element 100, the gain control output 118 of the low-voltage IF amplifier 112 is coupled to the gain control node 106 of the source amplifier 104. When the amplitude of the input signal at the differential input 122 of the fourth amplifier stage 202 of the low-voltage IF amplifier 112 is very small, the gain control element 204 sinks little or no current from the gain control node 106 of the source amplifier 104. Under this condition almost all of the substantially constant current through the resistor 416 flows through the first and second transistors 408, 410, thereby maximizing the gain of the source amplifier 104.

When the amplitude of the input signal at the differential input 122 of the fourth amplifier stage 202 of the low-voltage IF amplifier 112 increases beyond a predetermined level, the RSSD 346 thereof begins to increasingly deliver current to the summing node 206. This causes the gain control element 204 to increasingly sink current from the gain control node 106 of the source amplifier 104, reducing the current flowing through the first and second transistors 408, 410, and thereby reducing the gain of the source amplifier 104. When the amplitude of the input signal at the differential input 122 of the third amplifier stage 202 of the low-voltage IF amplifier 112 increases beyond the predetermined level, the RSSD 346 thereof also begins to increasingly deliver current to the summing node 206. This causes the gain control element 204 to sink even more current from the gain control node 106 of the source amplifier 104, further reducing the current flowing through the first and second transistors 408, 410, and thereby further reducing the gain of the source amplifier 104. This process repeats for the second amplifier stage 202, and then the first amplifier stage 202, as the signal amplitude at the RF output 120 of the source amplifier 104 increases further.

Figure 6:
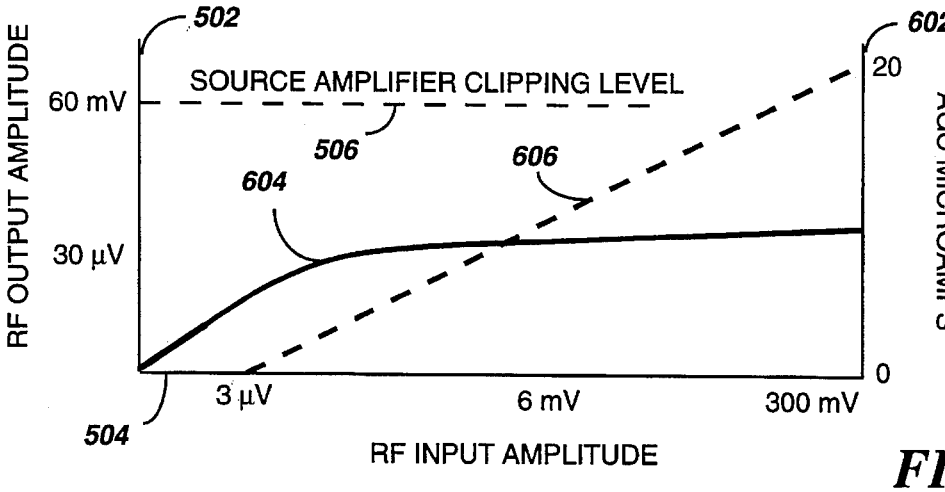
FIG. 6 is a graph depicting the source amplifier RF output amplitude and IF amplifier automatic gain control (AGC) current versus RF input amplitude with the gain control element enabled in accordance with the preferred embodiment of the present invention.

The cooperation between the gain control element 204 and the source amplifier 104 works to hold the amplitude of the signal at the RF output 120 at a relatively constant level, well below a level at which the source amplifier would clip the signal, over a wide range of RF input amplitudes, as depicted in FIG. 6. In addition, the design of the low-voltage IF amplifier stages 202 advantageously allows operation at power supply voltages as low as one volt. One-volt operation is especially important in battery-powered equipment operating from a single cell.

Nominal design values for the operating voltage and component values of the source amplifier 104 are listed below (150 MHz version).

| Power supply node 336 (BP) | 1.0 volt |
| --- | --- |
| Capacitors 404, 412 | 20 pF |
| Capacitors 420, 418 | 5 pF |
| Capacitor 402 | 0.1 μF |
| Inductors 406, 414 | 50 nH |
| Resistor 416 | 1.6K ohms |

It will be appreciated that other voltages and component values can be utilized as well, as a matter of design choice and depending upon parameters such as the desired frequency of operation.

Figure 5:
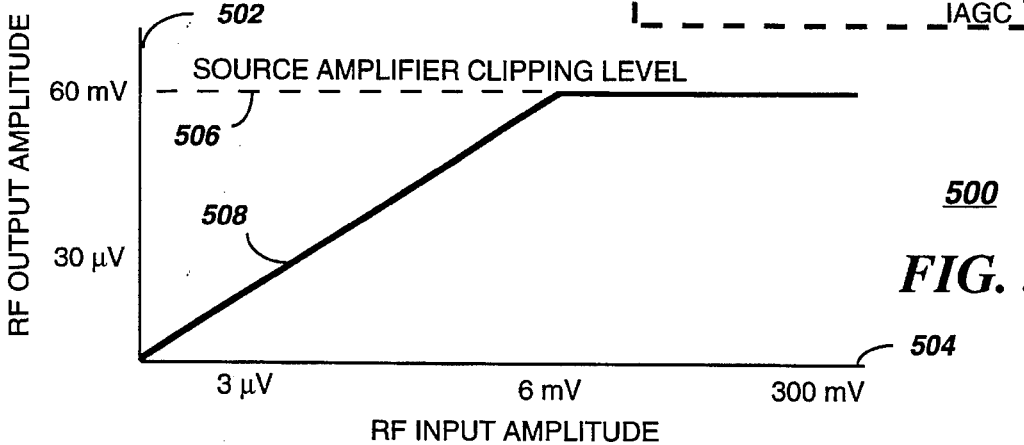
FIG. 5 is a graph depicting the source amplifier radio frequency (RF) output amplitude versus RF input amplitude when the gain control element is disabled.

With reference to FIG. 5, a graph 500 depicts the signal amplitude at the RF output 120 of the source amplifier 104 (into a 50-ohm load) versus the signal amplitude at the RF input 120 when the gain control element is disabled. The signal amplitude at the RF input 120 is depicted on the horizontal axis 504, while the signal amplitude at the RF output 120 is depicted on the vertical axis 502. The clipping level 506 of the source amplifier 104 is shown by a horizontal dashed line. The performance graph 508 indicates that for small input signal levels, the signal amplitude at the RF output 120 increases linearly with increasing signal amplitude at the RF input 120. The linearity exists until the RF output reaches the clipping level of the source amplifier 104, after which there is no further increase in the signal amplitude at the RF output 120. Operation at the clipping level is undesirable, because such operation causes the generation of spurious frequencies that can interfere with the amplification and demodulation of the radio signal.

With reference to FIG. 6, a graph 600 depicts the signal amplitude at the RF output 120 of the source amplifier 104 (into a 50-ohm load) and AGC current of the low-voltage IF amplifier 112, versus the signal amplitude at the RF input 120 with the gain control element enabled in accordance with the preferred embodiment of the present invention. The horizontal and vertical axes of the graph 600 are similar to those of the graph 500, the essential difference being the added vertical scale 602 depicting the AGC current. The performance graph 604 shows that, as in the graph 500, for very small input signal levels, the signal amplitude at the RF output 120 increases linearly with increasing signal amplitude at the RF input 120. As the RF output increases sufficiently for the gain control element 204 to begin sinking current away from the source amplifier 104, as shown by the AGC current graph 606, the resultant reduced gain of the source amplifier 104 advantageously prevents the signal amplitude at the RF output 120 from reaching the clipping level 506, thereby preventing the generation of the undesirable spurious frequencies.

Figure 7:
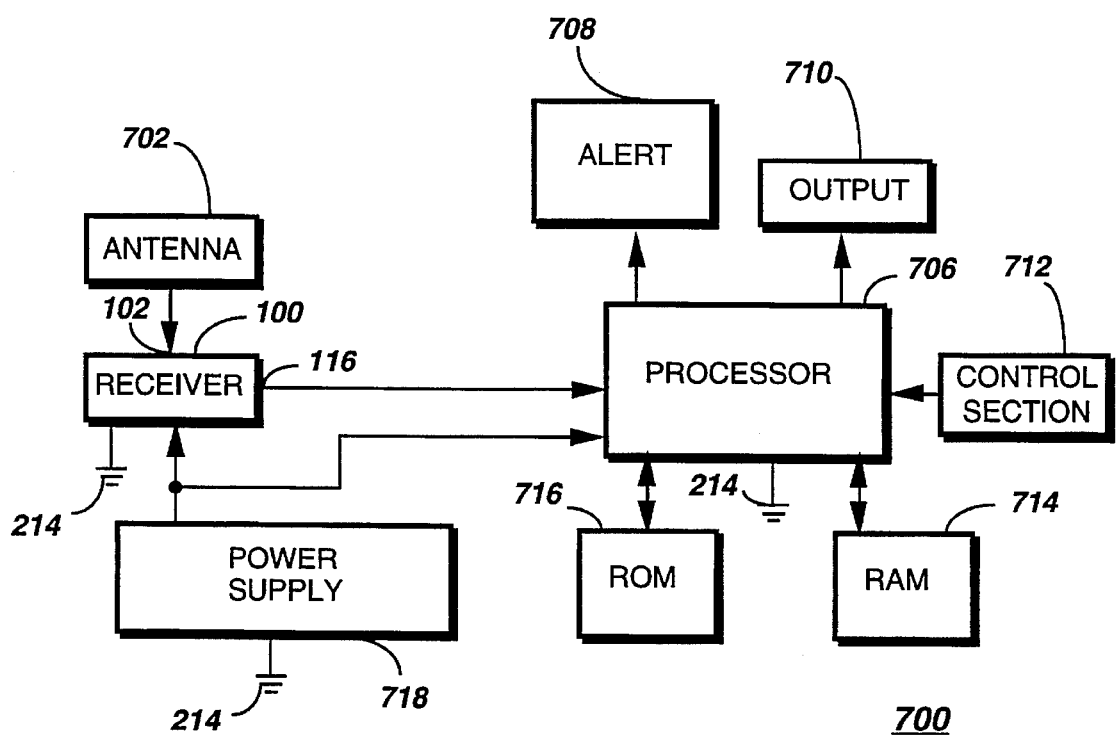
FIG. 7 is an electrical block diagram of a communication receiver in accordance with the preferred embodiment of the present invention.

With reference to FIG. 7, an electrical block diagram depicts a communication receiver 700 in accordance with the preferred embodiment of the present invention. The communication receiver 700 comprises a conventional antenna 702 for intercepting communication signals including information. The RF input 102 of the receiver element 100 in accordance with the preferred embodiment of the present invention is coupled to the antenna 702 for demodulating the communication signals to derive the information. A processor 706 is coupled to the demodulator output 116 of the receiver element 100 for processing the information. Preferably, the processor 706 is similar to the MC68HC05, C08, or C11 series microcomputer manufactured by Motorola, Inc. of Schaumburg, Ill. An alert element 708, e.g., a conventional piezoelectric transducer, is coupled to the processor 706 for generating an alert responsive to the information. An output device 710, e.g., a well-known liquid crystal display or a speaker, is coupled to the processor 706 for visibly or audibly reproducing the information. A control section 712, comprising well-known knobs, switches, and buttons, is coupled to the processor 706 for allowing a user to control the communication receiver 700. A conventional random access memory (RAM) 714 is coupled to the processor 706 for storing the information received. A conventional read only memory (ROM) 716 is also coupled to the processor 706 for storing operating software and other necessary parameters.

It will be appreciated that other types of ROM, e.g., electrically erasable programmable ROM (EEPROM) and electrically alterable ROM (EAROM), can be utilized as well for the ROM 716, and further that the processor 706, the ROM 716, and the RAM 714 can be fabricated as a contiguous integrated circuit in alternative embodiments in accordance with the present invention.

The communication receiver 700 further comprises the power supply 718 coupled between the circuit ground 214 and the receiver element 100 and processor 706 for providing various operating voltages and reference currents thereto. The power supply 718 preferably is battery-powered and can operate from a battery voltage as low as one volt.

Thus, it should now be clear that the present invention advantageously provides an AGC system that maintains receiver operation without signal overload, and that requires no more than 1.0 volt for reliable operation. The present invention is of particular significance to portable battery-powered communication receivers that operate from a single cell.

What is claimed is:

1. A low-voltage intermediate frequency (IF) amplifier for providing automatic gain control (AGC) of a source amplifier supplying an IF input signal to the low-voltage IF amplifier, the low-voltage IF amplifier comprising:

a plurality of cascaded amplifier stages, at least some of the plurality of cascaded amplifier stages comprising:

an amplifier element having an input for receiving a stage input signal, and an output for generating an amplified stage output signal in response to the stage input signal; and a received signal strength detector (RSSD) coupled to the amplifier element for generating a gain control current responsive to the stage input signal, wherein the low-voltage IF amplifier further comprises:

a current summer coupled to the plurality of cascaded amplifier stages for summing the gain control currents generated by the RSSDs thereof to produce a total gain control current; and a gain control element coupled to the source amplifier and coupled to the current summer for controlling gain of the source amplifier in response to the total gain control current, such that signal levels within the source amplifier are maintained within a linear operating range, wherein the gain control element comprises a current mirror that generates a source amplifier gain control current proportional to the total gain control current, the source amplifier gain control current coupled to the source amplifier for controlling the gain thereof.

2. The low-voltage intermediate frequency (IF) amplifier of claim 1, wherein the current summer is a common circuit node for receiving the gain control currents generated by the RSSDs.

3. The low-voltage intermediate frequency (IF) amplifier of claim 1, wherein the amplifier element comprises:

a first transistor having a collector, base, and emitter, wherein the collector of the first transistor is coupled through a first collector resistor to a power supply node, and wherein the base of the first transistor is coupled through a first base resistor to a base reference voltage and is also coupled through a first capacitor to a circuit ground and through a second capacitor to a first input node, and wherein the emitter of the first transistor is coupled through a first emitter resistor to a sink node;

a second transistor having a collector, base, and emitter, wherein the collector of the second transistor is coupled through a second collector resistor to the power supply node, and wherein the base of the second transistor is coupled through a second base resistor to the base reference voltage and is also coupled through a third capacitor to the circuit ground and through a fourth capacitor to a second input node, and wherein the emitter of the second transistor is coupled through a second emitter resistor to the sink node; and a third transistor having a collector, base, and emitter, wherein the collector of the third transistor is coupled to the sink node for sinking a current therefrom, and wherein the emitter of the third transistor is coupled to the circuit ground, and wherein the base of the third transistor is coupled to a first reference current for controlling the current from the sink node, wherein the first and second input nodes comprise the input of the amplifier element, and wherein the collectors of the first and second transistors comprise the output of the amplifier element.

4. The low-voltage intermediate frequency (IF) amplifier of claim 3, wherein the RSSD comprises:

a fourth transistor having a collector, base, and emitter, wherein the emitter of the fourth transistor is coupled to the power supply node, and wherein the base of the fourth transistor is coupled to a second reference current for controlling current through an operating node, and wherein the collector of the fourth transistor is coupled to the operating node for supplying current thereto;

a fifth transistor having a collector, base, and emitter, wherein the emitter of the fifth transistor is coupled to the operating node for receiving current therefrom, and wherein the base of the fifth transistor is coupled to the emitter of the second transistor for receiving a signal responsive to the stage input signal, and wherein the collector of the fifth transistor is coupled to the circuit ground; and a sixth transistor having a collector, base, and emitter, wherein the emitter of the sixth transistor is coupled to the operating node for receiving current therefrom, and wherein the base of the sixth transistor is coupled to an AGC reference voltage, and wherein the collector of the sixth transistor is coupled to the current summer for supplying the gain control current thereto, wherein geometry and bias levels of the fifth and sixth transistors are such that in response to a zero-amplitude stage input signal, the fifth transistor conducts a majority of the current available from the operating node, and wherein in response to a substantial-amplitude stage input signal, the sixth transistor conducts a majority of the current available from the operating node during alternate half cycles of the stage input signal, thereby generating the gain control current.

5. The low-voltage intermediate frequency (IF) amplifier of claim 4, wherein the power supply node provides a positive voltage with respect to the circuit ground, and wherein the first, second, and third transistors are bipolar NPN transistors, and wherein the fourth, fifth, and sixth transistors are bipolar PNP transistors.

6. A communication receiver, comprising:

an antenna for intercepting a signal including information;

a receiver element coupled to the antenna for demodulating the signal to derive the information;

a processor coupled to the receiver for processing the information;

an output element coupled to the processor for outputting the information; and a power supply providing a power supply voltage between a circuit ground and a power supply node, wherein the receiver element comprises a low-voltage intermediate frequency (IF) amplifier for providing automatic gain control (AGC) of a source amplifier supplying an IF input signal to the low-voltage IF amplifier, the low-voltage IF amplifier comprising:

a plurality of cascaded amplifier stages, at least some of the plurality of cascaded amplifier stages comprising:

an amplifier element having an input for receiving a stage input signal, and an output for generating an amplified stage output signal in response to the stage input signal; and a received signal strength detector (RSSD) coupled to the amplifier element for generating a gain control current responsive to the stage input signal, wherein the low-voltage IF amplifier further comprises:

a current summer coupled to the plurality of cascaded amplifier stages for summing the gain control currents generated by the RSSDs thereof to produce a total gain control current; and a gain control element coupled to the source amplifier and coupled to the current summer for controlling gain of the source amplifier in response to the total gain control current, such that signal levels within the source amplifier are maintained within a linear operating range, wherein the gain control element comprises a current mirror that generates a source amplifier gain control current proportional to the total gain control current, the source amplifier gain control current coupled to the source amplifier for controlling the gain thereof.

7. The communication receiver of claim 6, wherein the current summer is a common circuit node for receiving the gain control currents generated by the RSSDs.

8. The communication receiver of claim 6, wherein the amplifier element comprises:

a first transistor having a collector, base, and emitter, wherein the collector of the first transistor is coupled through a first collector resistor to the power supply node, and wherein the base of the first transistor is coupled through a first base resistor to a base reference voltage and is also coupled through a first capacitor to the circuit ground and through a second capacitor to a first input node, and wherein the emitter of the first transistor is coupled through a first emitter resistor to a sink node;

a second transistor having a collector, base, and emitter, wherein the collector of the second transistor is coupled through a second collector resistor to the power supply node, and wherein the base of the second transistor is coupled through a second base resistor to the base reference voltage and is also coupled through a third capacitor to the circuit ground and through a fourth capacitor to a second input node, and wherein the emitter of the second transistor is coupled through a second emitter resistor to the sink node; and a third transistor having a collector, base and emitter, wherein the collector of the third transistor is coupled to the sink node for sinking a current therefrom, and wherein the emitter of the third transistor is coupled to the circuit ground, and wherein the base of the third transistor is coupled to a first reference current for controlling the current from the sink node, wherein the first and second input nodes comprise the input of the amplifier element, and wherein the collectors of the first and second transistors comprise the output of the amplifier element.

9. The communication receiver of claim 8 wherein the RSSD comprises:

a fourth transistor having a collector, base, and emitter, wherein the emitter of the fourth transistor is coupled to the power supply node, and wherein the base of the fourth transistor is coupled to a second reference current for controlling current through an operating node, and wherein the collector of the fourth transistor is coupled to the operating node for supplying current thereto;

a fifth transistor having a collector, base, and emitter, wherein the emitter of the fifth transistor is coupled to the operating node for receiving current therefrom, and wherein the base of the fifth transistor is coupled to the emitter of the second transistor for receiving a signal responsive to the stage input signal, and wherein the collector of the fifth transistor is coupled to the circuit ground; and a sixth transistor having a collector, base, and emitter, wherein the emitter of the sixth transistor is coupled to the operating node for receiving current therefrom, and wherein the base of the sixth transistor is coupled to an AGC reference voltage, and wherein the collector of the sixth transistor is coupled to the current summer for supplying the gain control current thereto, wherein geometry and bias levels of the fifth and sixth transistors are such that in response to a zero-amplitude stage input signal, the fifth transistor conducts a majority of the current available from the operating node, and wherein in response to a substantial-amplitude stage input signal, the sixth transistor conducts a majority of the current available from the operating node during alternate half cycles of the stage input signal, thereby generating the gain control current.

10. The communication receiver of claim 9, wherein the power supply node provides a positive voltage with respect to the circuit ground, and wherein the first, second, and third transistors are bipolar NPN transistors, and wherein the fourth, fifth, and sixth transistors are bipolar PNP transistors.

\* \* \* \* \*